(12) United States Patent  
Bouten

(10) Patent No.: US 8,829,792 B2  
(45) Date of Patent: Sep. 9, 2014

(54) OLED WITH FLEXIBLE COVER LAYER

(75) Inventor: Petrus Cornelis Paulus Bouten, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/825,332

(22) PCT Filed: Sep. 23, 2011

(86) PCT No.: PCT/IB2011/054199  
§ 371 (c)(1),  
(2), (4) Date: Apr. 16, 2013

(87) PCT Pub. No.: WO2012/042451  
PCT Pub. Date: Apr. 5, 2012

(65) Prior Publication Data  
US 2013/0207541 A1    Aug. 15, 2013

(30) Foreign Application Priority Data  
Sep. 27, 2010    (EP) .................................... 10179987

(51) Int. Cl.  
*H01J 1/62*        (2006.01)  
*H01J 63/04*       (2006.01)

(52) U.S. Cl.  
USPC ........... 313/512; 313/483; 313/510; 313/511; 313/500; 313/501; 313/502; 313/503; 313/504; 313/505; 313/506

(58) Field of Classification Search  
None  
See application file for complete search history.

(56) References Cited

U.S. PATENT DOCUMENTS

| | | |
|---|---|---|
| 6,998,648 B2 | 2/2006 | Silvernail |
| 2003/0222578 A1 | 12/2003 | Cok |
| 2008/0238302 A1 | 10/2008 | Sung et al. |
| 2009/0130941 A1 | 5/2009 | Boroson et al. |
| 2011/0045732 A1* | 2/2011 | Suzuki et al. ............... 445/25 |

FOREIGN PATENT DOCUMENTS

| | | |
|---|---|---|
| JP | 2001118674 A | 4/2001 |
| WO | 2004086530 A1 | 10/2004 |
| WO | 2008032526 A1 | 3/2008 |
| WO | 2008132671 A2 | 11/2008 |
| WO | 2009086095 A2 | 7/2009 |
| WO | 2009139291 A1 | 11/2009 |
| WO | 2011161586 A1 | 12/2011 |

OTHER PUBLICATIONS

S. Timoshenko et al; "Theory of Plates and Shells", Second Edition, McGraw-Hill, 1959, pp. 1-591.

* cited by examiner

*Primary Examiner* — Natalie Walford  
(74) *Attorney, Agent, or Firm* — Meenakshy Chakravorty

(57) ABSTRACT

The invention relates to an OLED and its manufacture. The OLED comprises substrate (1), a first electrode layer (2), a package (3) of layers comprising organic electroluminescence material, a second electrode layer (4), a spacer layer (5) and a cover (6) being sealed to the substrate (1) via a sealing material (8). According to the invention, the cover (6) is formed as a layer of a flexible material which is permanently fixed to at least a part of the spacer layer (5). OLEDs with this feature have less moisture penetration and can be produced with less costs. Moreover, electrical contacts (11) between the cover (6) and one of the electrode layers (2, 4) are more reliable in OLEDs having this feature.

11 Claims, 2 Drawing Sheets

OLED WITH FLEXIBLE COVER LAYER

FIELD OF THE INVENTION

The invention relates to the field of organic electroluminescence devices, comprising a substrate, a first electrode layer, a package of layers comprising organic electroluminescence material, a second electrode layer, a spacer layer and a cover, said cover being sealed to the substrate via a sealing material. Such devices are commonly referred to as OLEDs. The invention also relates to a method of manufacturing these OLEDs.

BACKGROUND OF THE INVENTION

A device as indicated in the opening paragraph is described in the non-published patent publication EP 10166885.3 filed in the name of Applicant. The herein described OLED has a substrate of glass, on which respectively a first electrode layer of ITO, a package of layers comprising electroluminescence material (ELP) and a second electrode layer of Al are deposited. Said ELP is composed of a number of different sublayers, including at least an emission layer and a conductive layer. Upon applying an appropriate voltage between both electrode layers, the ELP emits light. Depending on the type of the electroluminescence materials used in the ELP, different light spectrums (colors') can be generated. The described layer package is contained in a cavity formed by a bowl-like cover. This cover is secured at its rim to the glass substrate by means of a sealing material.

The described OLED further contains a spacer layer (referred to in the previous application as 'separating foil'), which lies loose between the cover and the second electrode layer. Said spacer layer can act as a compliant protection layer which should prevent direct contact between the cover and the ELP. Such contact can cause mechanical damage to one of the electrodes or shorting. This holds especially when moisture-absorption means are provided on the inside surface of the cover. The spacer layer is made of a resilient material (such as polyethylene or Si-containing polymer).

The here-described OLED is of the so-called 'cavity-lid' type, in which the ELP is contained in a bowl-like cover. Another type of OLEDs is commonly referred to as the 'flat-lid' type. In this type, one of the substrates is usually glass or plastic whereas the other substrate (still often referred to as the 'cover') can be made by a relatively thin layer of glass material or of metal.

Although the described OLED in general shows good properties, there still exists a need for further improvements. This holds especially the sealing between the cover and the substrate. Good sealings are essential for a long functional life-span of the OLEDs. Such sealings should especially prevent the penetration of moisture into the OLED cells, as the OLED material is readily degraded by moisture. The general desire to manufacture larger OLED cells requires new approaches in the sealing of the cover to the substrate.

SUMMARY OF THE INVENTION

It is an object of the invention to enhance the moisture-resistance of the described OLEDs, especially by improving the quality of the sealings between their cover and substrate. Another object of the present invention is providing OLEDs having reliable electrical contacts between the cover and one of the electrode layers. The invention also aims at providing a method for the manufacture of OLEDs described in this paragraph.

This and/or other objects are achieved by an organic electroluminescence device, comprising 1) a substrate on which a first electrode layer is provided, 2) a package of layers comprising organic electroluminescence material, which package is provided on the first electrode layer, 3) a second electrode layer being provided on the package, 4) a spacer layer being provided on the second electrode layer, 5) a cover being provided on the spacer layer and being sealed to the substrate via a sealing material, wherein the cover is formed as a layer of a flexible material which is permanently fixed to at least a part of the spacer layer.

The invention is inter alia based on a deeper insight into and better understanding of the sealing process during the manufacture of OLED cells. The sealing material is often applied in a closed line on the substrate or on the cover of the OLED by means of a printing process. Height variations in the applied sealing material appear to be responsible for area's in the seal line where the adherence between the sealing material and the cover or the substrate is not optimal. Especially in these area moisture penetration can occur. The application of a cover layer of a flexible material appears to improve the sealing process. The inventor believes that improved sealings are obtained due to deflection of the flexible cover layer resulting in the application of mechanical forces on the seal line by the cover layer. Eventually in combination with the working of capillary forces between the cover layer and the sealing material during the sealing process a good adherence between the sealing material and the cover is obtained over substantially the full seal line length. As the cover layer is permanently fixed to the spacer layer, the finalized OLED has a rigid structure.

An interesting embodiment of the present invention is characterized in that the flexural rigidity of the cover is larger than 0.0001 Nm. For values of the flexural rigidity in this range a good contact between the sealing material and the cover is obtained. Below said minimum value, forces applied on the seal line are not sufficient to realize a good mechanical contact between sealing material and cover over substantially the full seal line length. Preferably, the flexural rigidity of the cover is larger than 0.001 Nm, more preferably larger than 0.01 Nm, even more preferably larger than 0.1 Nm. The flexural rigidity is calculated according to Equation (3) in "Theory of Plates and Shells" second edition, S. Timoshenko, S. Woinowsky-Krieger, McGraw-Hill (1959).

A further embodiment of the presently invented OLED has the feature wherein the cover comprises a metal layer. This metal layer can be part of layer package comprising one or more further layers of resins like polyethylene (PE), polyethylene theraphtalate (PET), etc. Good results have been obtained with OLEDs having a cover comprising a laminate of aluminium (Al) and PET. However, the cover can also exist of a single layer of metal or metal alloy (which can be coated with other metals), like Al or steel. Metal layers have the desired flexibility which makes these layers suitable for use as a cover in OLEDs according to the present invention and they have a relatively low permeability for moisture.

Another preferred embodiment of the invented OLED has the feature that the cover is curved around its circumference in a direction away from the device. An OLED of this type is obtained when during its manufacture the height of the sealing material is made larger than the height of the layer structure of the ELP, electrode layers and spacer layer. Due to the flexing stress during the curing of the sealing material, especially good mechanical contact over the substantially full length of the seal line between the cover layer and the sealing material is obtained.

Interesting is also the embodiment of the OLED according to the invention, wherein the sealing material comprises one of solder material and glass frit material. Contrary to the generally applied UV-curable adhesive materials, solder and glass frit sealing materials are difficult to use in the preparation of seal lines with uniform height. However, when using a flexible cover, even these materials can be used to obtain moisture-impermeable OLED sealings. Due to its flexibility, the cover is able to follow the height differences along the seal line as well as the height changes in the seal line during the curing process.

A further embodiment of the invented OLED has the feature that there exists a non-fixed zone at the circumference of the spacer layer. This measure provides additional flexibility to the cover. As a result improved sealings are obtained, even when larger height differences are faced in the seal lines during the curing process of the sealing material. Fixation of the cover to the spacer layer remains however essential. This fixation causes a flexing force of the cover on the seal line during curing of the sealing material. It is preferred that the width of the non-fixed zone is between 0.5 mm and 20.0 mm. A non-fixed zone range between 1.0 and 10.0 mm is preferred.

Much interest receives an OLED according to the present invention wherein the cover comprises a metal layer, which is connected with one of the electrode layers by means of an electrical contact. Electrical contacts of this type can be used in OLEDs having a large emitting area. Such contacts can be either between the metal cover layer and the first electrode layer or between the metal cover layer and the second electrode layer. If the contact is with the first electrode layer, measures should be taken that the contact does not short-cut with the second electrode layer. The presence of a flexible cover layer allows for a reliable electrical contact between the cover layer and the electrode layer. As OLEDs should function well under cycling temperature conditions, the reliability of such electrical contacts can be challenged due to differences in expansion coefficients of the contact material and the material of the surrounding layers. Thus, during such thermal cycling small changes in dimensions of the contact material can cause stressing or pulling forces on the metal cover layer. The flexibility of the metal cover layer can absorb these forces. As a result, the reliability of the electrical contacts is enhanced.

Especially interesting is also the OLED according to the invention wherein the electrical contact is surrounded by a zone in which the cover and the spacer layer are non-fixed. The presence of such non-fixed zone enhances the flexibility of the metal cover layer. Due to the enhanced flexibility of the cove layer, larger changes in dimensions of the contact material can be absorbed. Preferably, the non-fixed zone ranges from 0.5-10.0 mm. A non-fixed zone of 1.0-5.0 mm is more preferred.

The invention also relates to a method for attaching the cover of an electroluminescence device to its substrate, the device comprising a substrate on which a layer structure is deposited including respectively a first electrode layer, a package of layers comprising electroluminescence material, a second electrode layer and a spacer layer. According to the invention said method comprising the steps of 1) applying a closed line of curable sealing material on one of the substrate and the cover, 2) fixing the cover to the spacer layer, and 3) curing the sealing material, thereby attaching the cover to the substrate, whereby the cover is formed of a sheet of a flexible material. The spacer layer can be fixed to the cover by means of an adhesive.

In a preferred embodiment of the invented method, the line of curable sealing material comprises solder or glass frit and has a mean thickness larger than the thickness of the total layer structure (ELP, electrodes and spacer). During fixing of the cover to the spacer layer, the rim of the cover will flex away from the device at the moment that the layer contacts the curable sealing material. Due to flexing forces of the cover, said rim will follow the (somewhat variable) height of the sealing line, and presses the material it somewhat in the direction of the substrate. This improves the intimate contact between the sealing material and the flexible cover during the curing process. This results in a good sealing between the substrate and the cover, which sealing therefore has a low moisture-permeability.

In another preferred embodiment of the method according to the invention, the curing of sealing material is performed by drawing heat along the seal line. Due to the flexibility of the cover, there is no need to cure the complete seal line at the same moment. In case that a non-flexible cover is used, such in instantaneous heating of the complete seal line is needed. Latter heating is however rather cumbersome, since the OLED material degrades at temperatures needed for curing the seal line and in addition relative large equipment is required to allow such instantaneous and uniform heating of the complete seal line. When using this invented method, it is preferred that the heat is generated by means of a laser. When using a transparent substrate, the light generated by the laser can be drawn along the seal line via this substrate. As a result, less expensive tooling for manufacturing of an OLED is required.

Another preferred embodiment of the invented method has the feature that the cover comprises a metal layer, which is connected with one of the electrode layers by means of an electrical contact. Such electrical contact runs from the metal cover layer to the electrode layer via a hole in the spacer layer (to the second electrode layer) or via a hole in the spacer layer, the second electrode layer and the ELP (to the first electrode layer). The electrical contact comprises an electrically conductive material, and can be composed of solder or a resin filled with conductive particles.

BRIEF DESCRIPTION OF THE DRAWINGS

These and other aspects of the invention will be apparent from and elucidated with reference to the embodiments described hereinafter.

In the drawings.

It is stressed that for clarity reasons the Figure is schematic and not to scale.

DETAILED DESCRIPTION OF EMBODIMENTS

Figure 1:
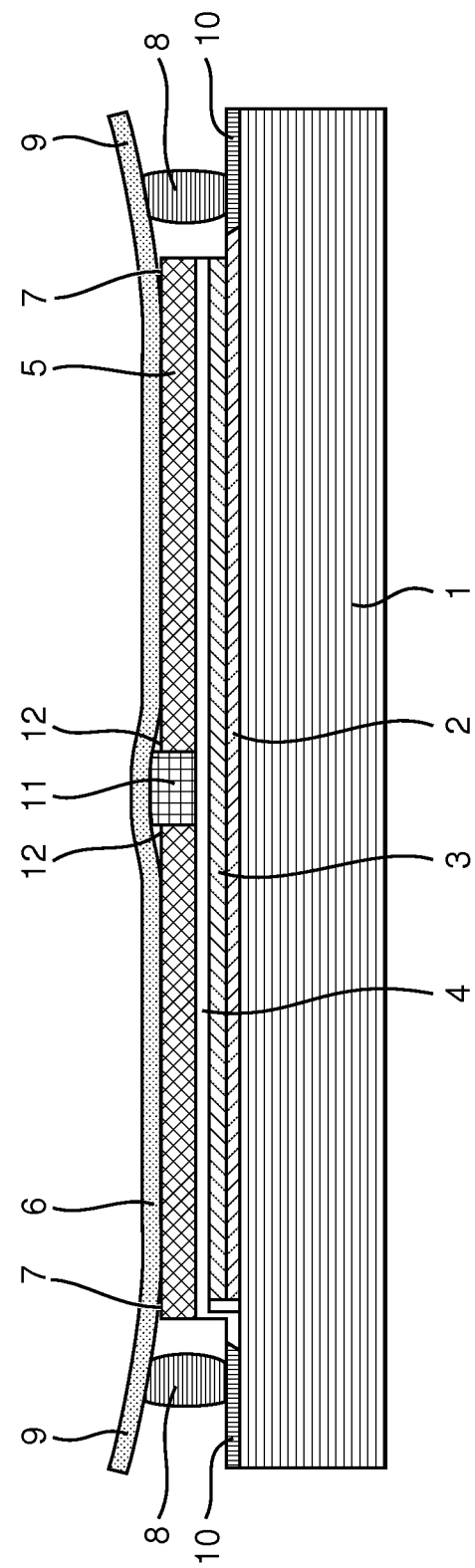
FIG. 1 shows the cross-section of a first embodiment of the OLED according to the present invention.

In FIG. 1, the cross-section of a first exemplary embodiment of an OLED according to the present invention is shown. It comprises a substrate 1 of glass having a thickness of 500 micrometer for example, on which a thin, first electrode layer 2 of ITO is sputtered having a thickness of 100 nm for example. On first electrode layer 2, a package 3 of layers comprising well-known electroluminesce materials (ELP) is applied by known techniques. The properties of the materials and the transparency window of the substrate 1 and the first electrode layer 2 are mutually tuned. ELP 3 is composed of several sublayers, including a conduction layer and an emission layer. Additional layers like a hole blocking layer and an electron blocking layer may be present in ELP 3 as well. On top of ELP 3, a second electrode layer 4 of Al is provided by means of metal evaporation. Layer 4 has a thickness of appr 100 nm and fully covers the surface of ELP 3. Leads 10 are attached to both electrode layers 2, 4, which leads run trough sealing material 8 to the outside world. The OLED has a length and a width of about 10 cm.

The OLED further comprises a spacer layer 5 of polymer material. In this embodiment, spacer layer 5 fully covers second electrode layer 4 at the edge of the second electrode layer 4 facing the sealing material 8, and the spacer layer 5 is fixed to the second electrode layer 4. In an alternative embodiment, the second electrode layer 4 is not fully covered by the spacer layer 5 at the edge of the second electrode layer 4 facing the sealing material 8. In the present situation a UV-cured polymer layer comprising fluoride side-groups was used. The UV-cured polymer may be prepared from a mixture comprising (meth)acrylate and/or epoxy monomers. The thickness of the spacer layer 5 was 200 micrometer. In this embodiment a single spacer layer is used. Composite layers of different materials may be used as well.

The OLED also comprises a cover 6, which is formed as a layer of flexible material. In the present embodiment, cover 6 is a thin metal layer (steel), having a thickness of 100 micrometer. Most generally thicknesses of metal, e.g. steel, cover layers can range between 20 and 400 micrometers without departing from the scope of the present invention. For example, the flexural rigidity of a cover 6 having a thickness of 200 μm is 0.15 Nm, the flexural rigidity of a cover 6 having a thickness of 100 μm is 0.019 Nm, the flexural rigidity of a cover 6 having a thickness of 50 μm is 0.0024 Nm, the flexural rigidity of a cover 6 having a thickness of 40 μm is 0.0012 Nm and the flexural rigidity of a cover 6 having a thickness of 20 μm is 0.00015 Nm. Cover 6 is permanently fixed to spacer layer 5 by means of a glue. Around the circumference of the spacer layer, there exists a non-fixed zone 7 having a width of approximately 3 mm.

Cover 6 is fixed along its rim to substrate 1 with a sealing material 8. Good results can be obtained if a UV-setting glue is used as sealing material 8. Regarding moisture-penetration, even better results are obtained with a hermetic sealing material 8 comprising a solder material or a glass frit material. In the present embodiment, a glass frit material has been used. Cover 6 is curved away around its circumference 9 from the device. This is caused by the specific choice of a thickness of the line of sealing material 8, which thickness is larger than the total thickness of the electrode layers 2, 4, the ELP 4 and the spacer layer 5. The degree of curvature of cover 6 depends on the flexibility of the cover layer and the size of the non-fixed zone 7, the distance of the line of sealing material and the spacer layer and the mentioned thickness difference. The non-fixed zone 7 is defined as the distance between the position where the cover 6 is not in contact any more with the spacer layer 5 and the position where the cover 6 is in contact with the centre (in a direction substantially parallel to the OLED) of the sealing material 8. Some calculation and experimentation work will lead the person skilled in the art to an optimal design in which the moisture penetration through the sealing material is minimal.

The OLED is also provided with an electrical contact 11 which electrically connects cover 6 and the second electrode layer 4. In the present embodiment, electrical contact 11 is composed of an metal particle-filled polymer material which is able to conduct electricity. Due to differences in expansion coefficient between the material of electrical contact 11 and spacer layer 5, compressive or tensile loads can be exerted on the connection face between the cover 6 and electrical contact 11 as well as between the electrode layer 4 and electrical contact 11. This holds especially when the OLED is used in temperature cycling conditions. Due to the flexibility of the cover 6, these loads are reduced. The degree of reduction of these loads depends on the difference in expansion coefficients between the materials of the contacts 11 and of the spacer layer 5, the flexibility of cover 6 and the free distance between the spacer layer 5 and the electrical contact 11. Some calculation and experimentation work will lead the person skilled in the art to an optimal design in which the compressive load on the electrical contact can be optimised such that a stable electrical contact between the cover 6 and the second electrode layer 4 is maintained while minimizing damage to the package 3 of layers comprising electroluminesce materials.

In the OLED shown in FIG. 1, a non-fixed zone 12 has been arranged for around contact 11, in which zone cover 6 is not fixed to spacer layer 5. This measure especially improves the reliability of the electrical contact 11 when the OLED is functioning under compressive loads at the electrical contact 11, as shown in FIG. 1. In the depicted OLED design, a non-fixed zone 12 of 1.5 mm has been arranged for.

Figure 2:
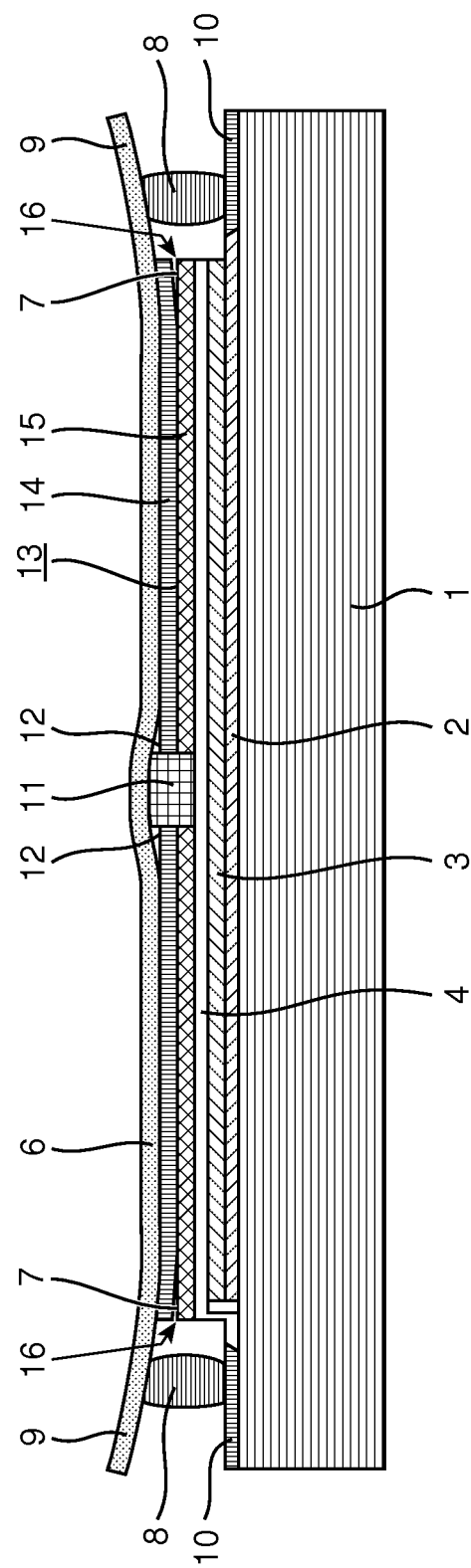
FIG. 2 shows the cross-section of a second embodiment of the OLED according to the present invention.

In FIG. 2, the cross-section of a second exemplary embodiment of an OLED according to the present invention is shown. Items denoted by the same reference numerals as in FIG. 1 have the same structural features and the same functions. In this embodiment, spacer layer 13 comprises a first sub-layer 14 and a second sub-layer 15 that are fixed to each other, except for a part at the edges 16 of the spacer layer 13 facing the sealing material 8. At the edges 16 the first sub-layer 14 is not in contact with the second sub-layer 15, while the second sub-layer 15 is in contact with the cover 6. In this embodiment, the non-fixed zone 7 is defined as the distance between the position where the first sub-layer 14 is not in contact any more with the second sub-layer 15 and the position where the cover 6 is in contact with the centre (in a direction substantially parallel to the OLED) of the sealing material 8. An advantage of this embodiment is that the OLED device structure is already mechanically protected by the first sub-layer (14) when the cover lid is applied and fixed with (adhesive) sub-layer 15.

The application of a cover comprising a layer of flexible material significantly improves OLEDs of the described design. This measure appears to reduce the penetration of moisture into the OLED cell considerably, since a substantially closed seal line is formed by allowing the cover to have different height adjustments at different locations. Additionally, the use of such flexible cover appears to improve the reliability of electrical contacts between the cover and one of the electrode layers. This all leads to OLEDs having a longer mean life-span.

The OLEDs according to the invention can be manufactured as follows. On a suitable substrate, preferably of glass, a layer structure is deposited with well known deposition techniques. This layer structure includes respectively a first electrode layer, a package of layers comprising organic electroluminescence material, a second electrode layer and (optionally) a spacer layer. In a next step, a closed line of a curable sealing material is provided either on the substrate or on the cover. The dimensions of the line with the sealing material is determined based on the dimensions of the layer structure. Subsequently the cover is fixed to the spacer layer, for example by a thermosetting glue. In an alternative approach, the spacer layer is first fixed to the cover, so that fixation of the spacer layer to the second electrode layer will be performed when attaching the cover to the substrate. Latter method is preferred in case that an electrical contact between the cover and the second electrode layer should be realized.

Preferably the thickness of the line of the sealing material is chosen such that the flexible layer of the cover curves away from the substrate when fixing the cover to the layer structure. The line of the sealing material is subsequently cured by means of a source of heat, which is drawn along the seal line. When using a transparent substrate, f.e. of glass material, it is advantageous to use a laser as heat producing source.

For clarity reasons, the manufacture of a single OLED according to the present invention has been described. It is of course also possible to apply the present invention also in mass production of OLED cells. In that situation, a large number of layer structures are deposited on a single substrate of large dimension. After applying the cover and curing the sealing material, such substrate is divided in small parts, each comprising a single OLED cell.

It is noted that the use of moisture-absorbing means is not essential for applying the present invention. However, such means can be incorporated in the OLED cells according to the present invention While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An organic electroluminescence device, comprising
a substrate on which a first electrode layer is provided,
a package of layers comprising organic electroluminescence material, which package is provided on the first electrode layer,
a second electrode layer being provided on the package,
a spacer layer being provided on the second electrode layer,
a cover being provided on the spacer layer and being sealed to the substrate via a sealing material, wherein the cover is formed as a layer of a flexible material having a flexural rigidity in the range of from larger than 0.0001 Nm to 0.15 Nm which is permanently fixed to at least a part of the spacer layer, wherein the cover is curved around its circumference in a direction away from the device, and wherein the cover comprises a metal layer, which is connected with one of the electrode layers by means of an electrical contact.

2. An organic electroluminescence device according to claim 1, wherein the cover comprises a metal layer.

3. An organic electroluminescence device according to claim 1, wherein the sealing material comprises one of solder material and glass frit material.

4. An organic electroluminescence device according to claim 1, wherein there exists a non-fixed zone at the circumference of the spacer layer.

5. An organic electroluminescence device according to claim 4, wherein the width of the non-fixed zone is between 0.5 and 20.0 mm.

6. An organic electroluminescence device according to claim 1, wherein the electrical contact is surrounded by a non-fixed zone in which the cover and the spacer layer are not in contact with each other.

7. An organic electroluminescence device according to claim 6, wherein the non-fixed zone ranges from 0.5-20.0 mm.

8. A method for attaching the cover of an electroluminescence device to its substrate, the device comprising a substrate on which a layer structure is deposited including respectively a first electrode layer, a package of layers comprising electroluminescence material, a second electrode layer and a spacer layer, said method comprising the following steps,
applying a closed line of curable sealing material on one of the substrate and the cover wherein the line of curable sealing material has a mean thickness larger than the thickness of the layer structure,
fixing the cover to the spacer layer,
curing the sealing material, thereby attaching the cover to the substrate, whereby the cover is curved and formed of a sheet of a flexible material, and wherein the cover comprises a metal layer, which is connected with one of the electrode layers by means of an electrical contact.

9. Method according to claim 8, wherein the line of curable sealing material comprises solder or glass frit.

10. Method according to claim 9, wherein the curing of sealing material is performed by drawing heat along the seal line.

11. Method according to claim 10, wherein the heat is generated by means of a laser.

* * * * *